United States Patent
Watabe et al.

(10) Patent No.: US 11,038,070 B2
(45) Date of Patent: Jun. 15, 2021

(54) HIGH PHOTOELECTRIC CONVERSION EFFICIENCY SOLAR CELL AND METHOD FOR MANUFACTURING HIGH PHOTOELECTRIC CONVERSION EFFICIENCY SOLAR CELL

(71) Applicant: SHIN-ETSU CHEMICAL CO., LTD., Tokyo (JP)

(72) Inventors: Takenori Watabe, Annaka (JP); Shun Moriyama, Annaka (JP); Hiroshi Hashigami, Annaka (JP); Hiroyuki Ohtsuka, Karuizawa-machi (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 16/342,557

(22) PCT Filed: Oct. 25, 2016

(86) PCT No.: PCT/JP2016/004693
§ 371 (c)(1),
(2) Date: Apr. 17, 2019

(87) PCT Pub. No.: WO2018/079669
PCT Pub. Date: May 3, 2018

(65) Prior Publication Data
US 2020/0052136 A1    Feb. 13, 2020

(51) Int. Cl.
*H01L 31/0224* (2006.01)
*H01L 31/05* (2014.01)
*H01L 31/068* (2012.01)

(52) U.S. Cl.
CPC .. *H01L 31/022458* (2013.01); *H01L 31/0516* (2013.01); *H01L 31/0682* (2013.01)

(58) Field of Classification Search
None
See application file for complete search history.

(56) References Cited

U.S. PATENT DOCUMENTS

2007/0261731 A1* 11/2007 Abe ................ H01L 31/035281
136/244
2008/0017243 A1*  1/2008 De Ceuster ........... H01L 31/061
136/255

(Continued)

FOREIGN PATENT DOCUMENTS

| JP | 2013-183004 A | 9/2013 |
| JP | 2015-118979 A | 6/2015 |

(Continued)

OTHER PUBLICATIONS

Apr. 30, 2019 International Preliminary Report on Patentability issued in International Patent Application No. PCT/JP2016/004693.

(Continued)

*Primary Examiner* — Eli S Mekhlin
(74) *Attorney, Agent, or Firm* — Oliff PLC

(57) ABSTRACT

A solar cell having, on a semiconductor substrate's first main surface a first conductivity type, a base layer having first conductivity type and an emitter layer which is adjacent to base layer and has a second conductivity type which is a conductivity type opposite to first conductivity type, the solar cell includes: a base electrode which is electrically connected with base layer; and an emitter electrode which is electrically connected with emitter layer, solar cell including: dielectric films which are in contact with base and emitter layer on first main surface; first insulator films which cover the emitter electrode, are placed on the dielectric films, and are arranged to have a gap at least on base layer; and a base bus bar electrode placed at least on first insulator (Continued)

films, and being wherein gap distance between the first insulator films is 40 μm or more and (W+110) μm or less.

4 Claims, 6 Drawing Sheets

(56) References Cited

U.S. PATENT DOCUMENTS

| | | | |
|---|---|---|---|
| 2010/0229928 A1* | 9/2010 | Zuniga | H01L 31/022441 136/255 |
| 2010/0323508 A1* | 12/2010 | Adibi | H01J 37/3171 438/513 |
| 2011/0120530 A1 | 5/2011 | Isaka | |
| 2013/0125967 A1 | 5/2013 | Yamazaki et al. | |
| 2015/0243806 A1* | 8/2015 | Hu | H01L 31/0682 438/71 |
| 2015/0243818 A1* | 8/2015 | Kim | H01L 31/022441 136/244 |
| 2017/0170338 A1 | 6/2017 | Matsuo et al. | |
| 2017/0186894 A1 | 6/2017 | Endo et al. | |

FOREIGN PATENT DOCUMENTS

| | | |
|---|---|---|
| JP | 2016-072467 A | 5/2016 |
| TW | 201611103 A | 3/2016 |
| WO | 2012/017517 A1 | 2/2012 |
| WO | 2012/081813 A1 | 6/2012 |
| WO | 2014/137283 A1 | 9/2014 |
| WO | 2015/190024 A1 | 12/2015 |
| WO | 2016/125430 A1 | 8/2016 |

OTHER PUBLICATIONS

Jan. 17, 2017 International Search Report issued in International Patent Application No. PCT/JP2016/004693.
Oct. 19, 2018 Search Report issued in European Patent Application No. 16897480.6.
May 16, 2018 Office Action issued in Taiwanese Patent Application No. 106106847.
Jul. 18, 2017 Office Action issued in Japanese Patent Application No. 2017-519718.
Nov. 21, 2017 Office Action issued in Japanese Patent Application No. 2017-519718.
Jan. 4, 2019 Office Action issued in Japanese Patent Application No. 2017-519718.
Dec. 25, 2018 Office Action issued in Japanese Patent Application No. 2018-022667.
Jun. 11, 2019 Office Action issued in European Patent Application No. 16897480.6.
Apr. 26, 2021 Examination Report issued in Indian Patent Application No. 201947016434.

* cited by examiner

[FIG. 1]
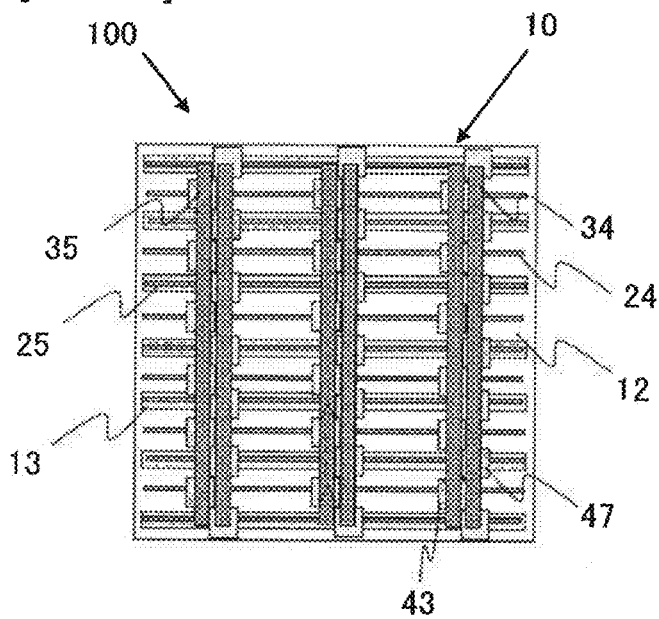
[FIG. 2]
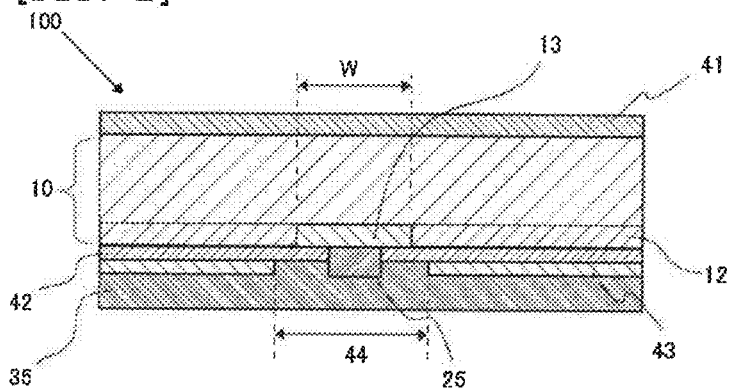
[FIG. 3]
(a)
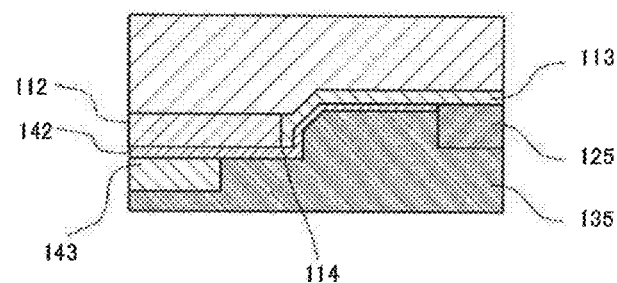
(b)
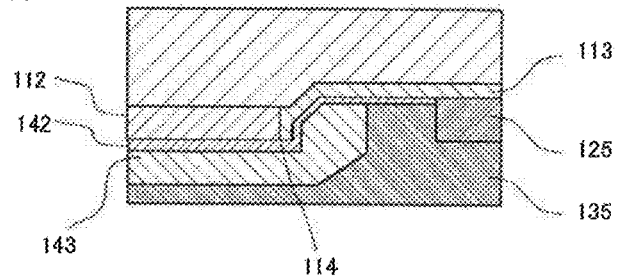

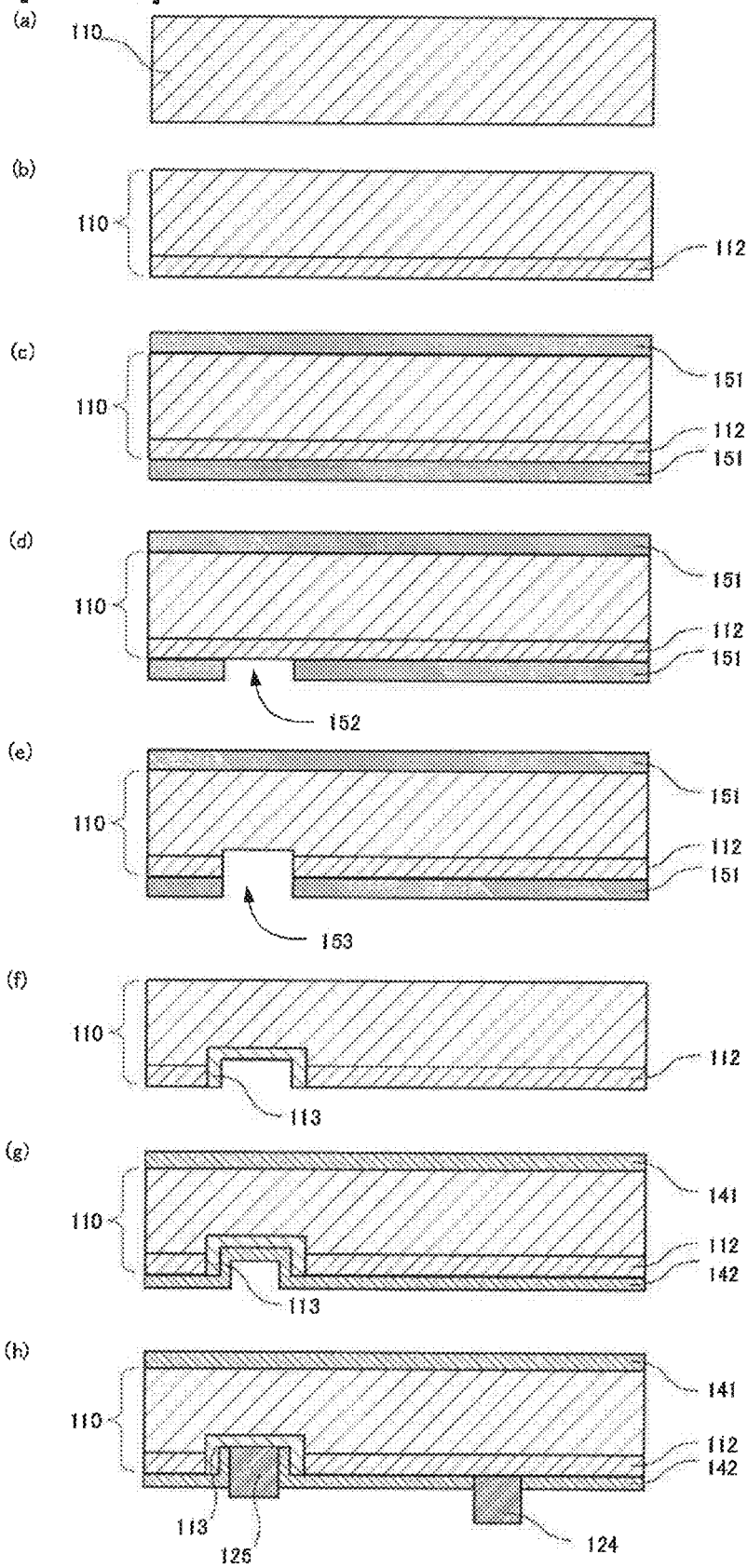
[FIG. 4]

[FIG. 5]
(a)
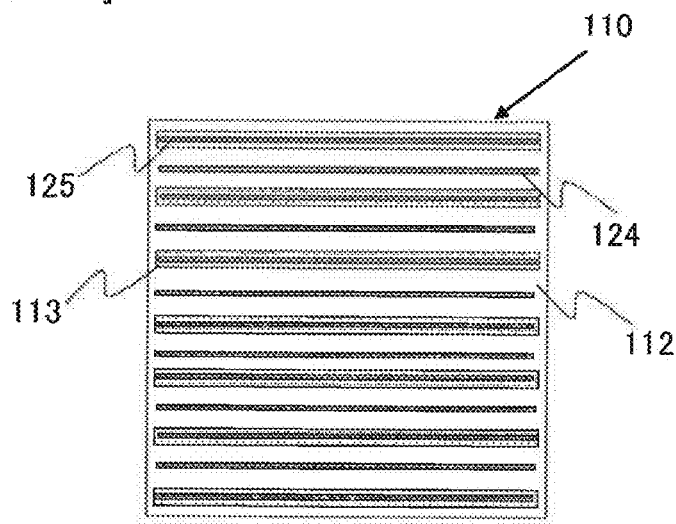
(b)
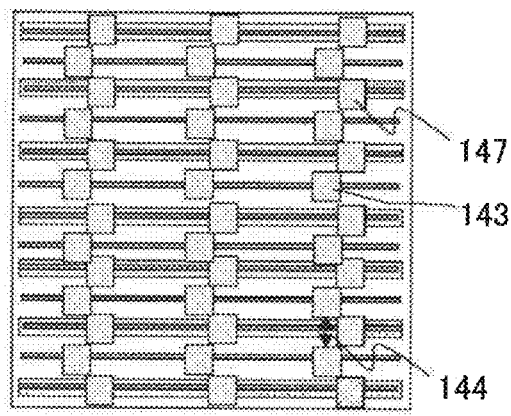
(c)
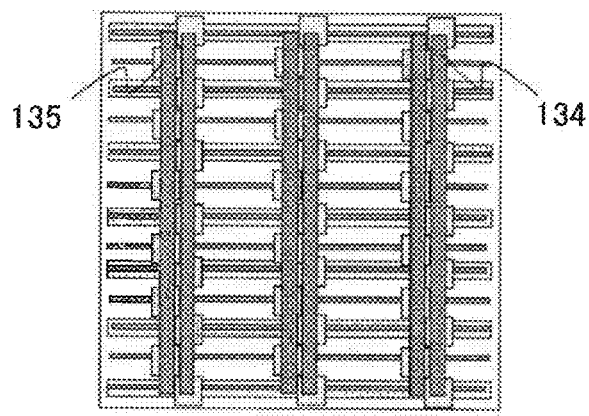

[FIG. 6]
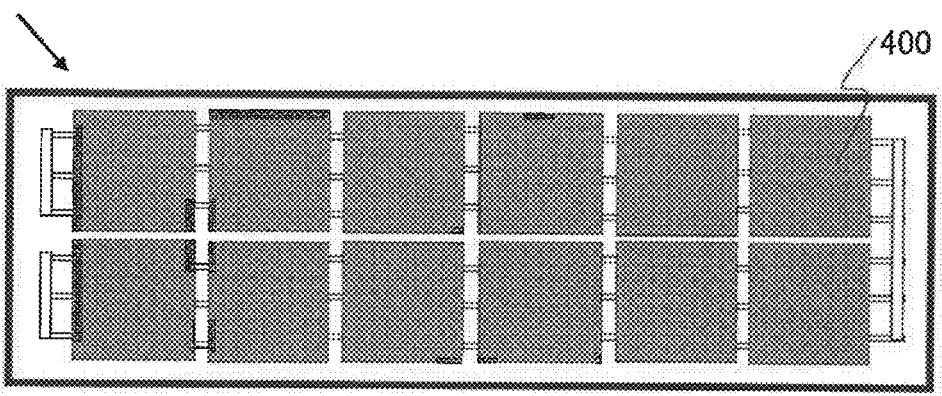
[FIG. 7]
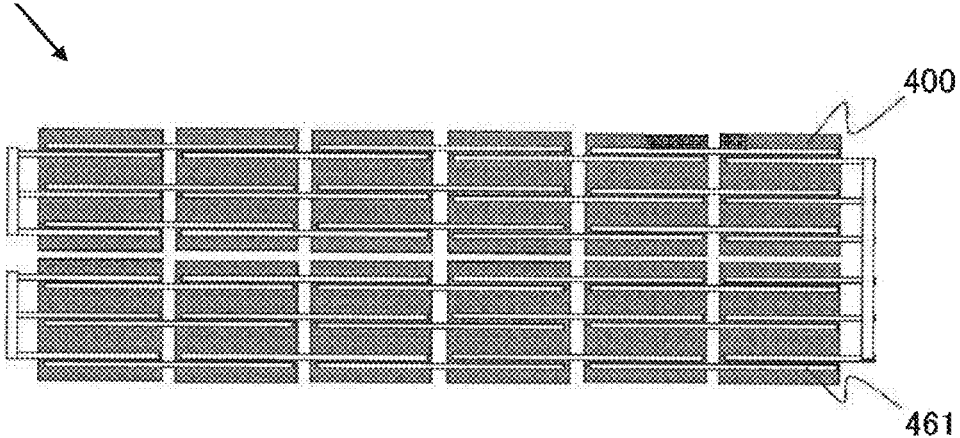
[FIG. 8]
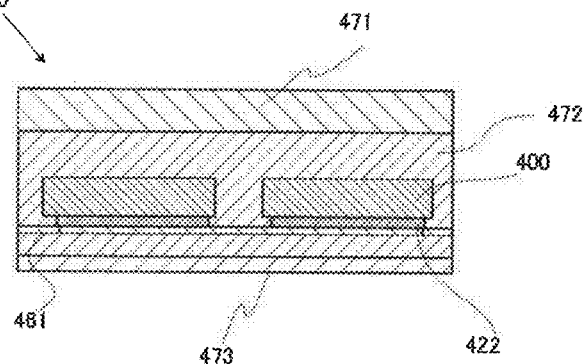

[FIG. 9]
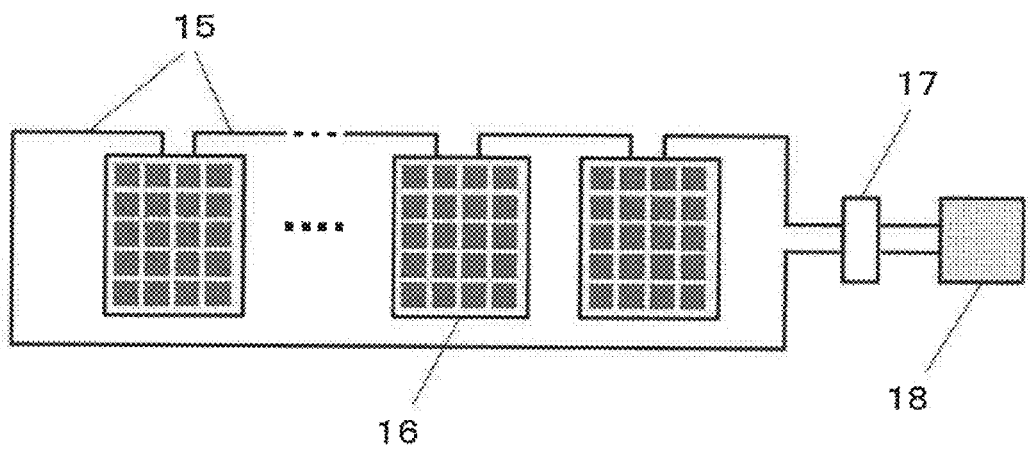
[FIG. 10]
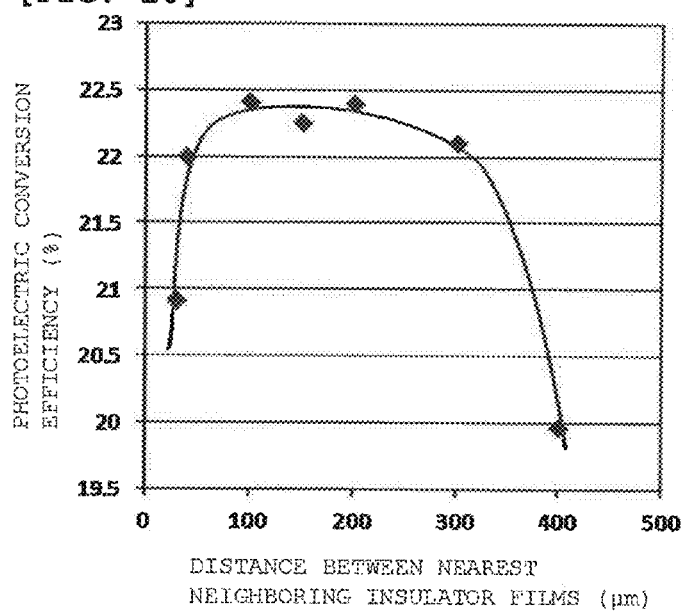
DISTANCE BETWEEN NEAREST
NEIGHBORING INSULATOR FILMS (μm)
[FIG. 11]
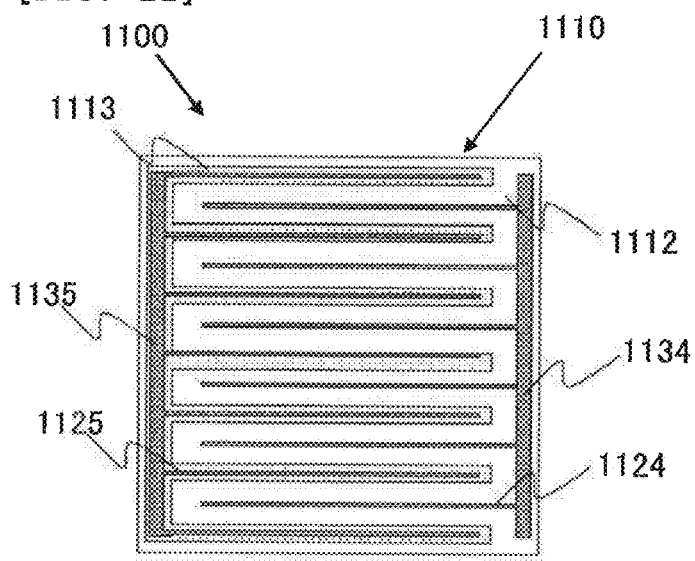

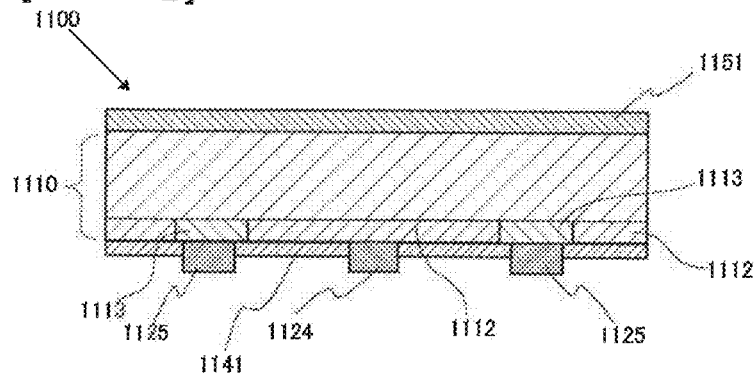
[FIG. 12]

HIGH PHOTOELECTRIC CONVERSION EFFICIENCY SOLAR CELL AND METHOD FOR MANUFACTURING HIGH PHOTOELECTRIC CONVERSION EFFICIENCY SOLAR CELL

TECHNICAL FIELD

The present invention relates to a high photoelectric conversion efficiency solar cell and a method for manufacturing a high photoelectric conversion efficiency solar cell.

BACKGROUND ART

As one of solar cell structures which use a single-crystal or polycrystalline semiconductor substrate and have relatively high photoelectric conversion efficiency, there is a backside contact solar cell having positive and negative electrodes all provided on a non-light receiving surface (a back surface). FIG. 11 shows an overview of a back surface of a backside contact solar cell 1100. On a back surface of a substrate 1110, emitter layers 1112 and base layers 1113 are alternately aligned, and electrodes (collecting electrodes) (emitter electrodes 1124 and base electrodes 1125) are provided along upper sides of the respective layers. Further, bus bar electrodes (an emitter bus bar electrode 1134 and a base bus bar electrode 1135) to further collect a current obtained from these electrodes are provided. It is often the case that the bus bar electrodes are orthogonal to the collecting electrodes due to their functions. A width of each emitter layer 1112 is several mm to hundreds of micrometers, and a width of each base layer 1113 is hundreds of micrometers to tens of micrometers. Further, a width of each of the collecting electrodes (the emitter electrodes 1124 and the base electrode 1125) is generally approximately hundreds to tens of micrometers, and this electrode is often called a finger electrode.

FIG. 12 shows a schematic view of a cross-sectional structure of the backside contact solar cell 1100. The emitter layers 1112 and the base layers 1113 are formed near the outermost layer on the back surface of the substrate. The thicknesses of each layer of the emitter layers 1112 and the base layers 1113 are 1 μm at the most. The finger electrodes 1124 and 1125 are provided on the respective layers, and a surface of a non-electrode region (a region where no electrode is formed) is covered with a dielectric film (a backside protective film 1141) such as a silicon nitride film or a silicon oxide film. For the purpose of reducing reflection loss, an antireflection film 1151 is provided on a light receiving surface side of the solar cell 1100.

A method for providing a plurality of bus bars to reduce a wiring resistance of the collecting electrodes in the backside contact solar cell is known from Patent Literature 1 (FIG. 9 in particular). According to this method, the collecting electrodes and the bus bars which face each other are separated through insulator films, and "there are many regions where the bus bar electrodes are directly in contact with the substrate, whereby shunt is apt to occur" (Paragraph [0040] in Patent Literature 1). Further, as solving means, in Patent Literature 1, an "arm" is provided to each bus bar, and the insulator film is provided in an entire region immediately below each bus bar (FIG. 1 in particular).

CITATION LIST

Patent Literature

Patent Literature 1: Japanese Unexamined Patent Application Publication No. 2016-072467

DISCLOSURE OF INVENTION

Problem to be Solved by the Invention

Although the method in Patent Literature 1 can avoid the direct contact between the bus bar electrodes and the substrate, it has a problem that a large amount of an insulating material or a bus bar electrode material is consumed for that. On the other hand, in the method for providing the plurality of bus bars to reduce the wiring resistance of the collecting electrodes in the backside contact solar cell, how much the known method affects the photoelectric conversion efficiency has not been clarified.

In view of the circumstance, it is an object of the present invention to provide a solar cell which can suppress consumption of an insulating material, reduce a drop in parallel resistance due to contact between a base bus bar electrode and an emitter region while excellently maintaining electrical contact between the base bus bar electrode and a base electrode, and improve solar cell characteristics.

Means for Solving Problem

To solve the problem, the present invention provides a solar cell which has, on a first main surface of a semiconductor substrate having a first conductivity type, a base layer having the first conductivity type and an emitter layer which is adjacent to the base layer and has a second conductivity type which is a conductivity type opposite to the first conductivity type, the solar cell including: a base electrode which is electrically connected with the base layer; and an emitter electrode which is electrically connected with the emitter layer, the solar cell also including: dielectric films which are in contact with the base layer and the emitter layer on the first main surface; first insulator films which cover the emitter electrode, are placed on the dielectric films, and are arranged to have a gap at least on the base layer; and a base bus bar electrode placed at least on the first insulator films, and being characterized in that a distance of the gap between the first insulator films is 40 μm or more and (W+110) μm or less (where W is a width of the base layer in a gap direction).

According to such a solar cell, a decrease in parallel resistance due to contact between the base bus bar electrode and the emitter region can be alleviated while excellently maintaining the electrical contact between the base bus bar electrode and the base electrode, and the solar cell characteristics can be improved. Further, a material for the insulator does not have to be consumed beyond necessity.

At this time, it is preferable for the base electrode to be electrically connected with the base bus bar electrode.

As described above, since the base electrode and the base bus bar electrode are electrically connected to each other, power collection can be further efficiently performed, and the efficiency of the solar cell can be enhanced.

Furthermore, it is preferable for a shape of the base layer which appears on the first main surface of the semiconductor substrate to be elongated, and for a width of this shape to be 50 μm or more and 200 μm or less.

Since such a base layer is provided, the power collection from the base layer can be efficiently carried out.

Moreover, it is preferable to further include second insulator films which cover the base electrode, and an emitter bus bar electrode which is placed at least on the second insulator films and electrically connected with the emitter electrode.

According to such a solar cell, the power collection from the emitter layer can be efficiently performed.

Additionally, the present invention provides a photovoltaic module including the solar cell incorporated therein.

As described above, the solar cell according to the present invention can be incorporated in the photovoltaic module.

Further, the present invention provides a photovoltaic power generation system including the photovoltaic module.

As described above, the photovoltaic module having the solar cell according to the present invention incorporated therein can be used in a photovoltaic power generation system.

Furthermore, the present invention provides a method for manufacturing a solar cell including: forming, on a first main surface of a semiconductor substrate having a first conductivity type, a base layer having the first conductivity type and an emitter layer which is adjacent to the base layer and has a second conductivity type which is a conductivity type opposite to the first conductivity type; forming dielectric films which are in contact with the base layer and the emitter layer on the first main surface; forming a base electrode electrically connected with the base layer; and forming an emitter electrode electrically connected to the emitter layer, the method also including: forming first insulator films so that they cover the emitter electrode, are placed on the dielectric films, and have a gap at least on the base layer; and forming a base bus bar electrode at least on the first insulator films, and the method being characterized in that, at forming the first insulator films, the insulator films are formed while setting a distance of the gap between the first insulator films to 40 µm or more and (W+110) µm or less (where W is a width of the base layer in a gap direction).

Such a method for manufacturing a solar cell makes it possible to manufacture a solar cell which can alleviate a decrease in parallel resistance due to the contact between the base bus bar electrode and the emitter region while excellently maintaining the electrical contact between the base bus bar electrode and the base electrode, and to improve the solar cell characteristics. Further, this is a method which does not have to consume a material for the insulator beyond necessity.

At this time, it is preferable for the base electrode to be electrically connected to the base bus bar electrode.

As described above, electrically connecting the base electrode with the base bus bar electrode enables manufacturing the solar cell which can more efficiently collect power.

Furthermore, it is preferable for a shape of the base layer which appears on the first main surface of the semiconductor to be elongated, and for a width of this shape to be set to 50 µm or more and 200 µm or less.

Forming such a base layer enables efficiently performing the power collection from the base layer.

Moreover, it is preferable to include forming second insulator films which cover the base electrode, and to form an emitter bus bar electrode which is placed at least on the second insulator films and electrically connected with the emitter electrode.

Forming such an emitter bus bar electrode enables efficiently performing the power collection from the emitter layer.

Effect of the Invention

According to the solar cell and the method for manufacturing a solar cell of the present invention, a decrease in parallel resistance due to the contact between the base bus bar electrode and the emitter region can be alleviated while excellently maintaining the electrical contact between the base bus bar electrode and the base electrode, and the solar cell characteristics can be improved. Additionally, the material for the insulator does not have to be consumed beyond necessity. Further, slightly changing a pattern of the insulator film printing plate enables improving the contact resistance between the base bus bar electrode and the emitter layer while maintaining the electrical contact between the bus bar electrode and the base electrode and also improving the conversion efficiency. Furthermore, when the distance between the nearest neighboring insulator films is increased, a positional accuracy in the insulator film formation can be roughened, and a time required for positioning can be shortened, thereby improving productivity. Moreover, the method for manufacturing a solar cell according to the present invention enables manufacturing such a high photoelectric conversion efficiency solar cell.

BRIEF DESCRIPTION OF DRAWINGS

FIG. 1 is an overview diagram of an example of a backside contact solar cell according to the present invention;

FIG. 2 is a schematic cross-sectional view of a vicinity of a base electrode and a base bus bar electrode in the example of the backside contact solar cell according to the present invention;

FIG. 3 is a schematic cross-sectional view showing an example of a vicinity of a base electrode end in the backside contact solar cell according to the present invention;

FIG. 4 is a schematic cross-sectional view showing an example of a method for manufacturing a backside contact solar cell according to the present invention;

FIG. 5 is a schematic view showing the example of the method for manufacturing a backside contact solar cell according to the present invention;

FIG. 6 is an overview diagram of a photovoltaic module according to the present invention;

FIG. 7 is a schematic view of an inside of a back surface of the photovoltaic module according to the present invention;

FIG. 8 is a schematic cross-sectional view of the photovoltaic module according to the present invention;

FIG. 9 is a schematic view of a photovoltaic power generation system according to the present invention;

FIG. 10 is a view showing a relationship between a distance between the nearest neighboring insulator films and conversion efficiency of the backside contact solar cell;

FIG. 11 is an overview diagram of a general backside contact solar cell; and

FIG. 12 is a schematic cross-sectional view of the general backside contact solar cell.

BEST MODE(S) FOR CARRYING OUT THE INVENTION

In the following detailed description, to understand the entire present invention and explain how the present invention is carried out in a given specific example, many specific details will be described. However, it can be understood that the present invention can be carried out without these specific details. To prevent obscureness of the present invention, a known method, procedures, and techniques will not be described in detail hereinafter. Although given specific examples of the present invention will be described with reference to specific drawings, but the present invention is not restricted thereto. The drawings included and explained herein are schematic, and do not restrict a scope of the present invention. Furthermore, in the drawings, for the purpose of illustration, sizes of some elements are exaggerated, and hence their scales may not be correct.

A configuration of a solar cell according to the present invention will now be described with reference to FIG. 1 and FIG. 2. FIG. 1 is a schematic top view showing an example of a back surface structure of a solar cell (a backside contact solar cell) according to the present invention. FIG. 2 shows a schematic cross-sectional view of a part A-A' in FIG. 1.

As shown in FIG. 1, a solar cell 100 has, on a first main surface (a back surface, a non-light receiving surface) of a semiconductor substrate 10 having a first conductivity type, base layers 13 having the first conductivity type and emitter layers 12 which are adjacent to the base layers 13 and have a second conductivity type which is a conductivity type opposite to the first conductivity type. Further, the solar cell 100 has base electrodes 25 electrically connected to the base layers 13 and emitter electrodes 24 electrically connected to the emitter layers 12. The solar cell 100 according to the present invention further has, on the first main surface of the semiconductor substrate 10, dielectric films 42 which are in contact with the base layers 13 and the emitter layers 12 (see FIG. 2).

The solar cell 100 further has first insulator films 43 which cover the emitter electrodes 24, are positioned on the dielectric films 42, and are arranged to have gaps at least on the base layers 13. The solar cell 100 has base bus bar electrodes 35 placed at least on the first insulator films 43. In the solar cell 100 according to the present invention, a distance 44 of each gap between the first insulator films 43 is 40 μm or more and (W+110) μm or less (where W is a width of the base layer 13 in a gap direction).

The solar cell 100 further has second insulator films 47 which cover the base electrodes 25, and preferably has emitter bus bar electrodes 34 which are placed at least on the second insulator films 47 and electrically connected to the emitter electrodes 24.

As shown in FIG. 1 and FIG. 2, it is preferable for the base electrodes 25 to be connected to the base bus bar electrodes 35. Furthermore, it is preferable for a shape of the base layer 13 which appears on the first main surface of the semiconductor substrate 10 to be elongated and for its width (i.e., a base region width W) to be 50 μm or more and 200 μm or less. The base bus bar electrode 35 has not been examined in relation to a level of an impact of electrical contact between the base bus bar electrode 35 and the emitter layer 12 since electrical contact with the semiconductor substrate 10 is not required due to its function and the backside protective film 42 which is often the dielectric film and an insulator is present. As a result of earnest studies conducted by the present inventors, it has been revealed that the solar cell characteristics are not considerably affected when the distance 44 of each gap between the first insulator films 43, i.e., a distance between the nearest neighboring insulator films in a base electrode and bus bar connecting portion is 40 μm or more and (W+110) μm or less, and that the solar cell characteristics are not affected when this distance is 40 μm or more and W μm or less. When the gap is W μm, or less, i.e., when the distance 44 of each gap between the first insulator films 43 is equal to or narrower than the width of the base layer 13, a contact resistance in a region of the base bus bar electrode 35 and a region of the emitter layer 12 can be completely ignored. However, if the distance 44 of this gap is less than 40 μm, there is a possibility that the base electrode 25 cannot come into contact with the base bus bar electrode 35. On the other hand, when the distance between the nearest neighboring insulator films exceeds W μm, an overlapping part is necessarily produced in a relationship between the base bus bar electrode 35 and the region of the emitter layer 12. However, it has been revealed that, even if the distance 44 of the gap exceeds W μm, the solar cell characteristics are not considerably affected as long as the distance falls within a range of (W+110) μm or less. When (W+110) μm is exceeded, the contact resistance of the bus bar and the emitter region is unignorable, and the solar cell characteristics are lowered. As described above, when the distance 44 between the nearest neighboring insulator films in the base electrode connecting portion is set to 40 μm or more to (W+110) μm or preferably 40 μm or more to W μm, the solar cell with high photoelectric conversion efficiency can be provided.

A specific method for manufacturing a solar cell according to the present invention will now be described hereinafter with reference to FIG. 4 while taking an N-type substrate as an example.

First, as shown in FIG. 4(a), a semiconductor substrate 110 having a first conductivity type (an N type in this example) is prepared. This semiconductor substrate 110 can be prepared as follows, for example. First, high-purity silicon is doped with a pentad such as phosphorous, arsenic or antimony to prepare an as-cut single crystal {100} N-type silicon substrate (a semiconductor substrate) 110 having a specific resistance of 0.1 to 5 Ω·cm. Then, slice damage on a surface of the semiconductor substrate 110 is subjected to etching using, e.g., a high-concentration alkali such as sodium hydroxide or potassium hydroxide having concentration of 5 to 60% or a mixed acid of a hydrofluoric acid and a nitric acid. The single-crystal silicon substrate may be fabricated by any one of a CZ method and an FZ method. The substrate does not have to be necessarily made of the single-crystal silicon, and it may be made of polycrystalline silicon. Subsequently, small irregularities called a texture are formed on the surface of the substrate 110. The texture is an effective method to reduce a reflectance of the solar cell. The texture is fabricated by immersing the substrate into a heated alkali solution (concentration: 1 to 10%, temperature: 60 to 100° C.) such as sodium hydroxide, potassium hydroxide, potassium carbonate, sodium carbonate, or sodium hydrogencarbonate for approximately 10 minutes to 30 minutes. A certain amount of 2-propanol may be dissolved in the solution to promote a reaction.

Then, on a first main surface of the semiconductor substrate 110 prepared as described above, a base layer having the first conductivity type (the N type in this example) and an emitter layer which is adjacent to the base layer and has a second conductivity type (a P type in this example) which is a conductivity type opposite to the first conductivity type are formed (see FIGS. 4(b) to (f)). This process can be specifically carried out as follows.

First, the semiconductor substrate 110 having the texture formed thereon as described above is cleaned in an acid aqueous solution of, e.g., a hydrochloride acid, a sulfuric acid, a nitric acid, a hydrofluoric acid, or a mixture of these members. Hydrogen peroxide may be mixed to improve cleanliness.

An emitter layer 112 is formed on the first main surface of this semiconductor substrate 110 as shown in FIG. 4(b).

The emitter layer 112 has a conductivity type (the P type in this example) opposite to that of the substrate 110, and has a thickness of approximately 0.05 to 1 μm. The emitter layer 112 can be formed by vapor phase diffusion using $BBr_3$ or the like. The substrates 110 are overlapped as a pair and put into a heat treatment furnace in this state, a mixed gas of $BBr_3$ and oxygen is introduced, and a heat treatment is performed at 950 to 1050° C. As a carrier gas, nitrogen or argon is preferable. Further, the emitter layer can be likewise formed by a method for applying a coating agent containing a boron source to the entire first main surface and performing the heat treatment at 950 to 1050° C. As the coating agent, for example, it is possible to use an aqueous solution containing 1 to 4% of boric acid as the boron source and 0.1 to 4% of polyvinyl alcohol as a thickener.

After forming the emitter layer 112, a mask (a barrier film) 151 for formation of a base layer as a subsequent step is formed on both main surfaces as shown in FIG. 4(c). As the mask 151, a silicon oxide film, a silicon nitride film, or the like can be used. When the CVD method is adopted, appropriately selecting a gas type to be introduced enables forming any film. In case of the silicon oxide film, this film can be formed by thermally oxidizing the semiconductor substrate 110. When the semiconductor substrate 110 is subjected to the heat treatment in an oxygen atmosphere at 950 to 1100° C. for 30 minutes to 4 hours, a silicon thermal oxide film of approximately 100 nm is formed. This heat treatment may be carried out in the same batch following the heat treatment for formation of the emitter layer 112. Then, as shown in FIG. 4(d) the mask in each part which serves as a base region is opened (a mask opening portion 152). Specifically, opening is performed to provide a parallel line shape so that an opening width becomes 50 μm to 200 μm and each interval becomes approximately 0.6 μm to 2.0 μm. To perform the opening, a photolithography method or a chemical method using an etching paste or the like can be adopted, or a physical method like a laser or a dicer may be also used.

After opening the mask, then, as shown in FIG. 4(e), the semiconductor substrate 110 is immersed in an alkali aqueous solution of, e.g., KOH or NaOH or the like heated to 50 to 90° C. to remove (etch) the unnecessary emitter layer 112 present in the opening portion 152 (the mask opening portion 153 from which the unnecessary emitter layer has been removed).

Then, as shown in FIG. 4(f), the base layer 113 is formed. To form the base layer 113, a vapor phase diffusion method using phosphorus oxychloride can be used. When the semiconductor substrate 110 is heat-treated in a mixed gas atmosphere of the phosphorus oxychloride, nitrogen, and oxygen at 830 to 950° C., a phosphorus diffused layer (an $N^+$ layer) which functions as the base layer 113 is formed. Besides the vapor phase diffusion method, the base layer can be likewise formed by a method for performing a heat treatment after spin-coating or printing a material containing the phosphorus.

In the formation of the base layer 113, it is preferable for a shape of the base layer 113 which appears on the first main surface of the semiconductor substrate to be elongated and to have a width of 50 μm or more and 200 μm or less. Specifically, at the time of forming the mask opening portion 152, adjusting the shape and a size of this portion enables easily adjusting the shape and a size of the base layer.

After forming the diffused layer, the mask 151 and glass formed on the surface of the substrate are removed by using a hydrofluoric acid or the like (see FIG. 4(f)).

Subsequently, as shown in FIG. 4(g), a dielectric film which is in contact with the base layer 113 and the emitter layer 112 is formed on the first main surface of the semiconductor substrate 110. At this time, an antireflection film may be formed on the second main surface at the same time or as a previous or subsequent step.

As the antireflection film 141 on the second main surface, a silicon nitride film, a silicon oxide film, or the like can be used. In case of the silicon nitride film, a plasma CVD apparatus is used to form the film with a film thickness of approximately 100 nm. As a reactant gas, monosilane ($SiH_4$) and ammonia ($NH_3$) are often mixed and used, but nitrogen can be used in place of $NH_3$. To adjust a process pressure, dilute the reactant gas, and promote a bulk passivation effect of the substrate when the polycrystalline silicon is used for the substrate, hydrogen is mixed in the reactant gas in some cases. In case of the silicon oxide film, the film can be formed by the CVD method, but higher characteristics can be provided from a film formed by a thermal oxidation method. To enhance a protection effect of the surface, an aluminum oxide film may be formed on the substrate surface in advance, and then the silicon nitride film, the silicon oxide film, or the like may be formed.

On the first main surface, likewise, a dielectric film 142 such as a silicon nitride film or a silicon oxide film can be used as a surface protective film. It is preferable to set a film thickness of the dielectric film 142 to 50 to 250 nm. Like the second main surface (a light receiving surface) side, the dielectric film can be formed by the CVD method in case of the silicon nitride film, and the same can be formed by the thermal oxidation method or the CVD method in case of the silicon oxide film. Furthermore, to enhance the protection effect of the surface, an aluminum oxide film may be formed on the substrate surface in advance, and then the silicon nitride film, the silicon oxide film, or the like may be formed.

Subsequently, as shown in FIG. 4(h), a base electrode 125 which is electrically connected to the base layer 113 is formed by, e.g., a screen printing method. For example, a plate having an opening width of 30 μm to 100 μm and a parallel line pattern with intervals of 0.6 to 2.0 mm is prepared in advance, and an Ag paste provided by mixing Ag powder and glass frit with an organic binder is printed along the base layer 113. Likewise, the Ag paste is printed as an emitter electrode 124 which is electrically connected to the emitter layer 112. The Ag paste for the base electrode and the Ag paste for the emitter electrode may be the same, or different pastes may be used. After the electrode printing, Ag powder is penetrated through (fire-through) the silicon nitride film or the like by a heat treatment so that the electrode can be conducive with silicon. It is to be noted that the base layer electrode and the emitter layer electrode can be separately baked. Baking is usually achieved by performing a treatment at a temperature of 700 to 850° C. for one to five minutes.

A process of forming an insulator film and a bus bar electrode will now be described with reference to FIG. 5. FIG. 5(a) is a top view of the semiconductor substrate 110 after the step of FIG. 4(h). Each emitter electrode 124 is formed on an emitter region (the emitter layer 112), and each base electrode 125 is formed on each base region (the baser layer 113). An insulating material (which turns to a first insulator film 143 when it is cured) is applied to this semiconductor substrate 110 in a pattern shape. At this time, each first insulator film 143 is formed to cover each emitter electrode 124 and to be placed on the dielectric film 142. Further, the first insulator films 143 are formed to have gaps at least on the base layers 113. At this time, the insulating material could be applied in such a pattern as shown in FIG. 5(b) so that each N bus bar (a base bus bar electrode connected with the base electrode in this case) does not become conductive with each emitter electrode and each P bus bar (an emitter bus bar electrode connected with the emitter electrode in this case) does not become conductive with the base electrode. For application, a screen printing method or the like can be used. In forming the first insulator films, assuming that a base region width is W, a distance 144 of a gap between the first insulator films in the base electrode and N bus bar connecting portions (a distance between the nearest neighboring insulator films) is set to 40 μm or more and (W+110) μm or less. This distance between the nearest neighboring insulator films is preferably 40 to W μm. Consequently, the solar cell with high photoelectric conversion efficiency can be provided. As the insulating material, it is possible to use a material containing one or more resins selected from a silicone resin, a polyimide resin, a polyamide-imide resin, a fluorine resin, a phenol resin, a melamine resin, an urea resin, polyurethane, an epoxy resin, an acrylic resin, a polyester resin, and a poval resin. After the material is applied by using, e.g., the screen printing method, it is cured at 100 to 400° C. for approximately one to 60 minutes.

At this time, second insulator films 147 which cover the base electrodes can be formed at the same time or on a previous or subsequent stage.

At last, the base bus bar electrodes are formed at least on the first insulator films. At this time, it is preferable to electrically connect the base electrodes with the base bus bar electrodes. Further, it is preferable to form the emitter bus bar electrodes 134 which are placed at least on the second insulator films 147 and electrically connected with the emitter electrodes 124. As shown in FIG. 5(c), the N bus bars (the base bus bar electrodes) 135 are connected with the base electrodes 125, the P bus bars (the emitter bus bar electrodes connected with the emitter electrodes) 134 are connected with the emitter electrodes 124, the N bus bars 135 and the emitter electrodes 124 are connected through the respective insulator layers, and the P bus bars 134 and the base electrodes 125 are connected through the respective insulator layers. As a bus bar material, a low-temperature curing conductive paste can be used. Specifically, it is possible to use a material consisting of one or more conductive materials selected from Ag, Cu, Au, Al, Zn, In, Sn, Bi, and Pb and a material containing one or more resins selected from an epoxy resin, an acrylic resin, a polyester resin, a phenol resin, and silicone resin. The material is applied in a pattern shape by using, e.g., the screen printing method, a dispenser, or the like, and then it is cured at 100 to 400° C. for one to 60 minutes.

In the present invention, at forming the first insulator films, the insulator films are formed so that a distance of a gap between the first insulator films becomes 40 μm or more and (W+110) μm or less (where W is a width of the base layer in a gap direction). Specifically, at the time of applying the insulating material, adjustment can be carried out so that the distance of the gap between the first insulator films has such values.

FIG. 3 shows a cross-sectional schematic view of a vicinity of a base layer end of the solar cell 100 fabricated by the method. When the fabrication is carried out by the method, a base layer end 114 corresponds to a boundary between the emitter layer 112 and the base layer 113. A noteworthy point is a positional relationship of the insulator film 143 to the base layer end 114 and the base electrode 125. As shown in FIG. 3(b), when the emitter layer 112 is completely covered with the insulator film 143, high solar cell characteristics can be exerted. Furthermore, according to the present invention, as shown in FIG. 3(a), even if the emitter layer 112 is exposed to some extent (namely, a state where a region in which the emitter layer 112 is provided without interposing the insulator film 143 and the emitter layer 112 is adjacent to the base bus bar electrode 135 through the dielectric film 142 alone), electrical conduction between the emitter layer 112 and the base bus bar electrode 135 is avoided to some extent due to presence of the dielectric film 142, and a decrease in solar cell characteristics can be alleviated.

Although the example of the N-type substrate has been described above, in case of the P-type substrate, phosphorous, arsenic, antimony, or the like could be diffused in formation of the emitter layer, boron, Al, or the like could be diffused in formation of the base layer, and the method according to the present invention can be used.

The solar cell manufactured by the method can be used for manufacture of a photovoltaic module. FIG. 6 shows an overview of an example of a photovoltaic module having the built-in solar cell manufactured by the method. The solar cells 400 fabricated by the method are configured in such a manner that they are laid like tiles within a photovoltaic module 460.

In the photovoltaic module 460, several to tens of solar cells 400 adjacent to each other are electrically connected in series and constitute a series circuit called a string. FIG. 7 shows an overview of the string. FIG. 7 corresponds to a schematic view of a back surface side in the module which cannot be usually seen. Further, a finger electrode or a bus bar electrode is not shown. To achieve the series connection, as shown in FIG. 7, a P bus bar (a bus bar electrode connected to the finger electrode joined to a P-type layer of a substrate) and an N bus bar (a bus bar electrode connected to the finger electrode joined to an N-type layer of the substrate) of the adjoining solar cells 400 are connected to each other through a lead wire 461 or the like.

FIG. 8 shows a schematic cross-sectional view of the photovoltaic module 460. As described above, the string is constituted by connecting the plurality of solar cells 400 to the lead wires 461 through bus bar electrodes 422. The string is usually sealed in by using a filler 472 having translucency such as EVA (ethylene vinyl acetate), and a non-light receiving surface side is covered with a weatherable resin film 473 such as PET (polyethylene terephthalate), and a light receiving surface is covered with a light receiving surface protective material 471 having translucency and high mechanical strength such as soda-lime glass. As the filler 472, besides the EVA, polyolefin, silicone, or the like can be used.

Moreover, a photovoltaic power generation system can be manufactured and configured by using this photovoltaic module. FIG. 9 shows a basic structure of the photovoltaic power generation system having the modules according to the present invention coupled with each other. A plurality of photovoltaic modules 16 are coupled in series through wirings 15, and generated electric power is supplied to an external load circuit 18 through an inverter 17. Although not shown in FIG. 9, the system may further include a secondary cell which stores the generated electric power.

EXAMPLES

The present invention will now be more specifically described hereinafter with reference to an example and a comparative example, but the present invention is not restricted thereto.

Example

A solar cell was fabricated by using the method according to the present invention.

First, 10 phosphorus-doped {100} N-type as-cut silicon substrates each having a thickness of 200 μm and a specific resistance of 1 Ω·cm were prepared (see FIG. 4(a)). Then, a damage layer of each of the silicon substrates was removed by a hot concentrated potassium hydroxide solution, thereafter each substrate was immersed into a potassium hydroxide/2-propanol solution of 72° C. to form a texture, and then it was cleaned in a hydrochloric acid/hydrogen peroxide mixed solution heated to 75° C.

Subsequently, the two substrates were overlapped as a pair and put into a heat treatment furnace in this state, a mixed gas of $BBr_3$, oxygen, and argon was introduced, and a heat treatment was carried out at 1000° C. for 10 minutes. Consequently, an emitter layer was formed (see FIG. 4(b)). As a result of measurement based on a four-point probe method, a sheet resistance was 50Ω.

This substrate was thermally oxidized in an oxygen atmosphere at 1000° C. for three hours to form a mask (see FIG. 4(c)).

The mask on the back surface of the substrate was opened by a laser (see FIG. 4(d)). As a laser source, a second harmonic wave of $Nd:YVO_4$ was used. As an opening pattern, a parallel line shape having intervals of 1.2 mm was used.

The substrate was immersed in KOH of 80° C., and the emitter layer in the opening portion was removed (see FIG. 4(e)).

Then, in a phosphorus oxychloride atmosphere, the light receiving surfaces of the substrates were overlapped and heat-treated at 870° C. for 40 minutes in this state to form a phosphorus diffusion layer (a base layer) in the opening portion (see FIG. 4(f)). Thereafter, this substrate was immersed into a hydrofluoric acid having concentration of 12% to remove glass on the surface.

After the treatment, a silicon nitride film was formed on both surfaces of the substrate with the use of a plasma CVD apparatus (see FIG. 4(g)). A film thickness was set to 100 nm on both the front and back surfaces. At this stage, a width of the base layer was measured with the use of a microscope, and it was approximately 190 μm.

Subsequently, an Ag paste was printed on the base layer and the emitter layer by using a screen printer and then dried, respectively (see FIG. 4(h)). This substrate was baked in an air atmosphere at 780° C.

An insulating material was printed on this substrate in a pattern shape by using the screen printer. As the insulating material, silicone manufactured by Shin-Etsu Chemical Co., Ltd. was used. At this time, printing plates each having an opening width of the insulating films sandwiching the base electrodes therebetween set to 30, 40, 100, 150, 200, 300, or 400 μm were prepared in advance, and printing was carried out by using the respective plates. With the use of a microscope, it was observed that the emitter region immediately below each N bus bar was completely closed with the insulator film when the opening width was 30, 40, 100, 150, or 200 μm since the base layer width was 190 μm. Furthermore, in case of 30 and 40 μm, positions where the base electrode was completely covered with the insulator film were also found. On the other hand, in case of 300 and 400 μm, the emitter region was exposed immediately below the N bus bar. These substrates were cured in a belt furnace at 200° C. for five minutes.

At last, six straight lines of a low-temperature curing Ag paste were printed by the screen printer and cured in the belt furnace at 300° C. for 30 minutes, thereby providing bus bars.

Current-voltage characteristics of each of the thus-obtained solar cell samples were measured by using a solar simulator manufactured by Yamashita Denso Corporation under conditions of an AM 1.5 spectrum, irradiation intensity of 100 mW/cm$^2$, and 25° C., and photoelectric conversion efficiency was thereby obtained. Moreover, a distance between the nearest neighboring insulator films sandwiching the base electrode in each obtained soar cell was actually measured by using a microscope.

FIG. 10 shows an obtained result as a relationship between the distance between the nearest neighboring insulator films and the conversion efficiency. In case of 40 to 200 μm, a decrease in conversion efficiency is not confirmed. That is because the N bus bar was completely separated from the emitter region by the insulator film. It is to be noted, in case of this example, since the base layer width W is approximately 190 μm as described above, the distance between the nearest neighboring insulator films of 200 μm corresponds to (W+10) μm. When the distance between the nearest neighboring insulator films is set to 300 μm (i.e., (W+110) μm), a decrease is observed, but a decreasing amount is slight. That is because an influence of a contact resistance between the N bus bar and the emitter region on the conversion efficiency is small. In case of 400 μm, a considerable decrease is observed. That is because an influence of the contact resistance between the N bus bar and the emitter region is not negligible. Moreover, a considerable decrease occurs in case of 30 μm because the base electrode is completely covered with the insulator film, which causes an increase in series resistance.

It is to be noted that the present invention is not restricted to the foregoing embodiment. The foregoing embodiment is an illustrative example, and any example which has substantially the same configuration and exerts the same functions and effects as the technical concept described in claims of the present invention is included in the technical scope of the present invention.

The invention claimed is:

1. A solar cell which has, on a first main surface of a semiconductor substrate having a first conductivity type, a base layer having the first conductivity type and an emitter layer which is adjacent to the base layer and has a second conductivity type which is a conductivity type opposite to the first conductivity type, the solar cell comprising:
   a base electrode which is electrically connected with the base layer;
   an emitter electrode which is electrically connected to the emitter layer;
   dielectric films which are in contact with the base layer and the emitter layer on the first main surface;
   first insulator films which cover the emitter electrode, are placed on the dielectric films, and are arranged to have a gap at least on the base layer;
   second insulator films which cover the base electrode;
   an emitter bus bar electrode which is placed at least on the second insulator films and electrically connected with the emitter electrode; and a base bus bar electrode which is placed at least on the first insulator films and electrically connected with the base electrode, wherein a distance of the gap between the first insulator films is more than W μm and W+110 μm or less where W is a width of the base layer in a gap direction, and a shape of the base layer which appears on the first main surface of the semiconductor substrate is elongated, and a width of this shape is 50 μm or more and 200 μm or less.

2. A photovoltaic module comprising the solar cell according to claim 1 incorporated therein.

3. A photovoltaic power generation system comprising the photovoltaic module according to claim 2.

4. A method for manufacturing a solar cell cell, the method comprising:

forming, on a first main surface of a semiconductor substrate having a first conductivity type, a base layer having the first conductivity type and an emitter layer which is adjacent to the base layer and has a second conductivity type which is a conductivity type opposite to the first conductivity type;

forming dielectric films which are in contact with the base layer and the emitter layer on the first main surface;

forming a base electrode electrically connected with the base layer;

forming an emitter electrode electrically connected with the emitter layer;

forming first insulator films so that they cover the emitter electrode, are placed on the dielectric films, and have a gap at least on the base layer;

forming second insulator films which cover the base electrode;

forming an emitter bus bar electrode which is placed at least on the second insulator films and electrically connected with the emitter electrode; and forming a base bus bar electrode which is placed at least on the first insulator films and electrically connected with the base electrode, wherein a distance of the gap between the first insulator films is more than W μm and (W+110) μm or less where W is a width of the base layer in a gap direction, and a shape of the base layer which appears on the first main surface of the semiconductor substrate is elongated, and a width of this shape is 50 μm or more and 200 μm or less.

* * * * *